US007768326B2

United States Patent
Kaneko

(10) Patent No.: US 7,768,326 B2
(45) Date of Patent: Aug. 3, 2010

(54) WIDE RANGE OPERATIONAL CHARGE PUMP CIRCUIT

(75) Inventor: Masaaki Kaneko, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/212,730

(22) Filed: Sep. 18, 2008

(65) Prior Publication Data

US 2010/0066420 A1    Mar. 18, 2010

(51) Int. Cl.
*H03L 7/06* (2006.01)

(52) U.S. Cl. ...................... 327/157; 327/148

(58) Field of Classification Search ................ 327/148, 327/157
See application file for complete search history.

(56) References Cited

U.S. PATENT DOCUMENTS

| 5,740,213 | A | 4/1998 | Dreyer | |
|---|---|---|---|---|
| 6,222,402 | B1* | 4/2001 | Boerstler et al. | 327/157 |
| 6,292,061 | B1* | 9/2001 | Qu | 331/17 |
| 6,385,265 | B1* | 5/2002 | Duffy et al. | 375/374 |
| 6,531,913 | B1* | 3/2003 | Ross | 327/536 |
| 6,611,160 | B1* | 8/2003 | Lee et al. | 327/157 |
| 6,870,423 | B2 | 3/2005 | Takauchi | |
| 7,202,717 | B2* | 4/2007 | Keaveney et al. | 327/157 |
| 7,271,619 | B2* | 9/2007 | Kawago et al. | 326/87 |

* cited by examiner

*Primary Examiner*—Lincoln Donovan
*Assistant Examiner*—Adam D Houston
(74) *Attorney, Agent, or Firm*—Law Offices of Mark L. Berrier

(57) ABSTRACT

A charge pump that includes cascode transistors and current mirror circuitry to form a folded cascode structure that isolates the control inputs from the charge pump output and also increases the range of the output. The charge pump includes inputs to receive UP and DN (down) control signals and provides an output current that is based on the control signals. The charge pump may be configured as either a differential or non-differential device. The switching transistors that receive the control signals may use a lower voltage than the current source transistors in the charge pump In differential-type embodiments of the present charge pump, an amplifier can be used to control current source transistors based on differences between the output voltages of the charge pump, thereby adjusting the current flowing through the current source transistors and driving the average of the output voltages to a desired common mode voltage.

15 Claims, 8 Drawing Sheets

WIDE RANGE OPERATIONAL CHARGE PUMP CIRCUIT

BACKGROUND

1. Field of the Invention

The invention relates generally to the field electronics, and more particularly to charge pump circuits that can be used in systems such as phase locked loops.

2. Related Art

Charge pumps are used in a variety of electronic circuits. Charge pumps are commonly found in the phase locked loops (PLL's). In a PLL, a charge pump typically receives to input signals, one of which drives the charge pump to increase the charge at its output, and the other of which drives the charge pump to decrease the charge at its output. As the charge at the output of the charge pump increases or decreases, a voltage is developed with respect to ground. This voltage is applied to the input of a voltage controlled oscillator (VCO) to control the frequency of the signal that is output by the VCO.

Typically, the design of a charge pump must take into account a trade-off between the range of output voltages that can be generated by the charge pump and the amount of ripple in the charge pump's output current. This trade-off is controlled, for the most part, by the size of the switching transistors through which the output current flows. Larger switching transistors allow greater current to flow at the output of the charge pump, enabling a wider range of voltages. The larger transistors, however, also produce a greater ripple in the current. Smaller switching transistors reduce the amount of ripple in the output current, but they also limit the range of voltages that can be generated by the charge pump.

It would therefore be desirable to provide a charge pump that can generate a wider range of voltages at its output without increasing the amount of ripple in the output current. Alternatively, it would be desirable to provide a charge account that can generate the same range of voltages at its output with a reduced amount of ripple in the output current.

Another problem that is present in conventional charge pumps is their inability to directly accept low-voltage input signals. Typically, the analog components of a conventional PLL (including the charge pump) operate at a higher supply voltage than the digital components of the PLL (e.g., the phase and frequency detector that provides the input signals to the charge pump.) Because the control signals generated by the phase and frequency detector have a lower voltage range than the signals expected by the charge pump, the charge pump's interpretation of the control signals is subject to increased errors resulting from noise in the signals. Since the charge pump cannot reliably interpret the low-voltage signals directly from the phase detector, it is necessary to implement a converter to convert the low-voltage signals output by the phase detector in to higher-voltage signals that are acceptable as inputs to the charge pump.

It would therefore be desirable to provide a charge pump that can directly accept the low-voltage signals from the phase detector, thereby eliminating the need for the converter circuitry to increase the voltage of the control signals.

SUMMARY OF THE INVENTION

One or more of the problems outlined above may be solved by the various embodiments of the invention. Broadly speaking, the invention includes charge pumps that have a wider output voltage range than can be achieved by conventional charge pumps. The present charge pumps can also be configured to accept and reliably interpret control signals received directly from components (e.g., phase and frequency detectors) that operate at lower voltages. Differential-type embodiments of the present charge pump can also be configured to automatically adjust the output voltages so that the average of the voltages is driven to a common mode voltage.

One embodiment of the present invention comprises a charge pump that includes cascode transistors and current mirror circuitry to form a folded cascode structure. This structure isolates the control inputs from the charge pump output and also increases the range of the output. The charge pump includes inputs to receive UP and DN (down) control signals (e.g., from a phase and frequency detector) and has an output that provides an output current that is based on the control signals. When neither of the control signals is asserted, the output current is substantially zero. When the UP signal is asserted, the output current is positive. When the DN signal is asserted, the output current is negative. The charge pump may be configured as either a differential or non-differential device.

In one embodiment, the switching transistors that receive the control signals are constructed using a thin oxide layer and operate using the lower voltage used by other thin-oxide devices in the system. These switching transistors can therefore accept the lower-voltage control signals without introducing errors that would result from noise in a higher-voltage device. In differential-type embodiments of the present charge pump, an amplifier can be used to control current source transistors based on differences between the output voltages of the charge pump, thereby adjusting the current flowing through the current source transistors and driving the average of the output voltages to a desired common mode voltage.

Numerous additional embodiments are also possible.

The various embodiments of the present invention may provide a number of advantages over the prior art. For example, the present charge pumps may be able to achieve a wider range of output voltages than were achievable by previous designs. The present charge pumps may also be configured to directly accept control signals from lower-voltage devices without the need to convert the control signals to the higher voltage at which the charge pump operates. Still further, differential versions of the present charge pumps may also be configured to automatically adjust the output voltage levels so that their average is driven to the level of a common mode voltage.

BRIEF DESCRIPTION OF THE DRAWINGS

Other objects and advantages of the invention may become apparent upon reading the following detailed description and upon reference to the accompanying drawings.

Figure 1:
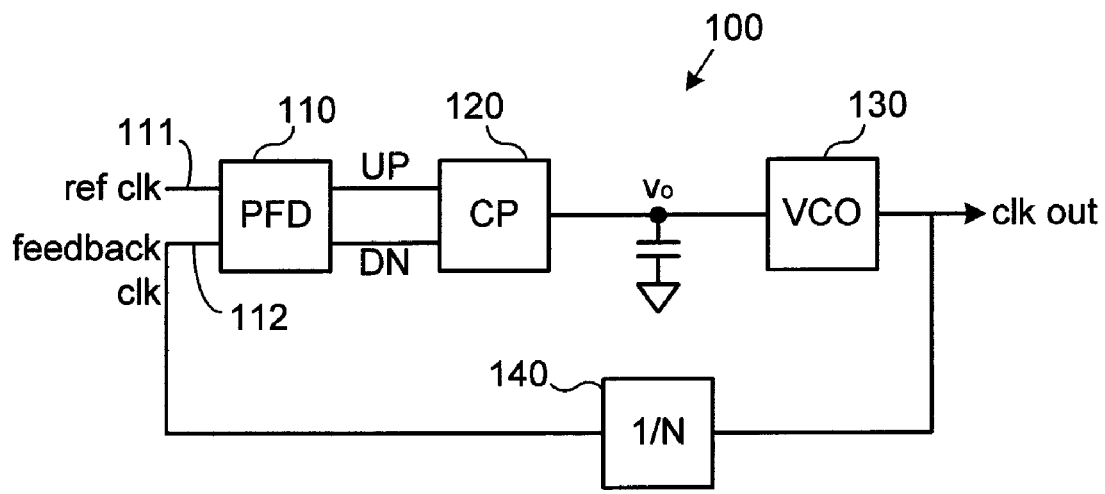
FIG. 1 is a diagram illustrating the structure of a conventional PLL circuit.

While the invention is subject to various modifications and alternative forms, specific embodiments thereof are shown by way of example in the drawings and the accompanying detailed description. It should be understood that the drawings and detailed description are not intended to limit the invention to the particular embodiments which are described. This disclosure is instead intended to cover all modifications, equivalents and alternatives falling within the scope of the present invention as defined by the appended claims.

DETAILED DESCRIPTION OF EXEMPLARY EMBODIMENTS

One or more embodiments of the invention are described below. It should be noted that these and any other embodiments described below are exemplary and are intended to be illustrative of the invention rather than limiting.

Broadly speaking, the invention includes systems and methods for increasing the range of output voltages that can be generated by a charge pump by using a folded cascode structure in the charge pump.

In an exemplary embodiment, a charge pump is configured to receive four input signals—UP, DN, UPb and DNb. UPb and DNb are the inverses of UP and DN, respectively. The charge pump is configured to produce an output current, or based on these for input signals, that can drive an output voltage ($v_o$) upward or downward within a particular range of voltages. If UP is asserted (and UPb deasserted) there is a positive output current and the voltage is driven upward. If DN is asserted (and DNb deasserted) there is a negative output current and the voltage is driven downward.

A folded cascode structure is implemented in the charge pump to increase the range of output voltages that can be achieved by the charge pump relative to a conventional charge pump that uses comparably sized transistors. The cascode transistors not only make the output current of the charge pump more stable, but also enable the charge pump to achieve an output voltage range which is greater than that of the conventional structure.

Before describing an exemplary embodiment of the invention in more detail, it will be helpful to explain the structure and operation of a typical conventional PLL circuit and charge pump.

Referring to FIG. 1, a diagram illustrating the structure of a conventional PLL circuit is shown. PLL circuit 100 includes a phase/frequency detector 110, a charge pump 120, a voltage controlled oscillator 130 and a frequency divider 140. Phase/frequency detector 110 receives to input signals—a reference clock signal on line 111 and a feedback clock signal on line 112. Phase/frequency detector 110 compares these signals and generates control signals that are dependent upon the relative phase and frequency of the reference and feedback clock signals. If the frequency of the feedback clock signal is less than the frequency of the reference clock signal, phase/frequency detector 110 asserts an UP control signal. If the frequency of the feedback clock signal is greater than the frequency of the reference clock signal, phase/frequency detector 110 asserts a DN control signal. If the frequencies of the feedback and reference clock signals are equal, neither of the UP and DN control signals are asserted.

The UP and DN control signals are output by phase/frequency detector 110 and are provided to charge pump 120. Charge pump 120 generates an output current based on the UP and DN control signals received from phase/frequency detector 110. If UP is asserted, charge pump 120 generates a positive output current that drives the voltage $v_o$ at the output of the charge pump upward. If DN is asserted, charge pump 120 generates a negative output current that drives the voltage $v_o$ at the output of the charge pump downward. If neither UP nor DN is asserted, the output current of charge pump 120 is zero, so $v_o$ is maintained at its current level.

The output of charge pump 120 is coupled to the input of voltage controlled oscillator 130. Voltage controlled oscillator 130 generates a clock signal at its output which is based on the output voltage generated by charge pump 120. More specifically, the frequency of the clock signal generated by voltage controlled oscillator 130 is controlled by the voltage at its input. When voltage $v_o$ increases, the frequency of the VCO clock signal increases. When voltage $v_o$ decreases, the frequency of the VCR clock signal decreases. In this manner, phase/frequency detector 110 and charge pump 120 control the frequency of the clock signal generated by VCO 130.

The clock signal generated by VCO 130 is, in this embodiment, provided to the input of clock divider 140. Clock divider 140 is used in this embodiment to reduce the frequency of clock signal before providing it as the feedback clock signal to phase/frequency detector 110. This allows VCO 130 to generate a clock signal that has a frequency which is a multiple of the frequency of the reference clock input to phase/frequency detector 110. As noted above, phase/frequency detector 110 compares this feedback clock signal to the reference clock signal and generates UP and DN control signals to drive the frequency of the feedback clock signal to the frequency of the reference clock signal.

Figure 2:
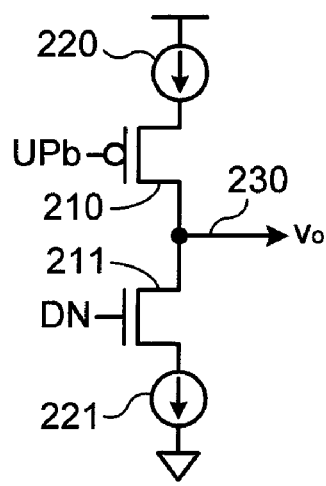
FIG. 2 is a diagram illustrating the concept of a charge pump.

Referring to FIG. 2, a diagram illustrating the concept of a charge pump is shown. The charge pump basically uses UP and DN control signals to control the current flowing from the output of the charge pump. Two transistors 210 and 211 are connected between the output 230 of the charge pump and current sources (or current source and current sink) 220 and 221. When UP is asserted (high) and DN is deasserted (low), current flows from source 220, through transistor 210, and through output 230. When UP is deasserted (low) and DN is asserted (high), current flows from output 230, through transistor 211 and current sink 221 to ground. As current flows from source 220 output 230, charge is built up at the output and the voltage at the output increases. When current flows from the output through sink 221, the charge and the corresponding voltage at the output is reduced.

Figure 3:
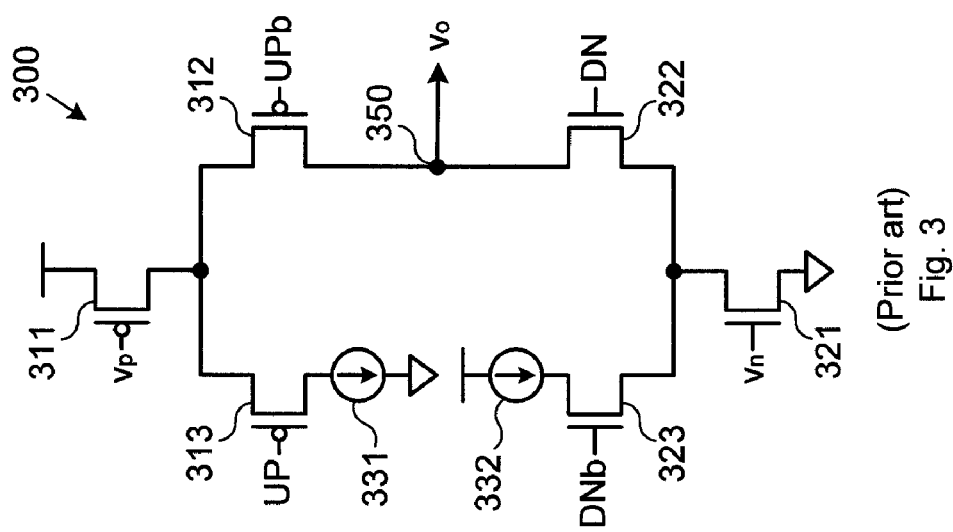
FIG. 3 is a diagram illustrating the structure of a typical conventional charge pump.

Referring to FIG. 3, a diagram illustrating the structure of a typical conventional charge pump is shown. Charge pump 300 consists of three p-type transistors 311-313, three n-type transistors 321-323, a current sink 331 and a current source 332. The source of p-type transistor 311 is tied to the positive voltage rail (Vdd.) the drain of transistor 311 is tied to the sources of p-type transistors 312 and 313. The drain of transistor 313 is tied to current sink 331, while the drain of transistor 312 is tied to drain of n-type transistor 322 at output node 350. The drain of n-type transistor 323 is connected to current source 332. The sources of transistors 322 and 323 are both tied to the drain of n-type transistor 321. The source of transistor 321 is tied to the negative voltage rail (ground.)

The operation of the charge pump in FIG. 3 is very similar to that illustrated in FIG. 2. A bias voltage $v_p$ is applied to the gate of p-type transistor 311. This bias voltage is sufficient to cause the transistor to operate in the saturation region, so that a saturation current flows through the transistor. Similarly, a bias voltage $v_n$ is applied to the gate of n-type transistor 321 to cause a saturation current to flow through it.

When neither UP nor DN are asserted, transistors 313 and 323 are switched on. Consequently, current flows from the positive voltage rail, through transistors 311 and 313, and through current sink 331 to the negative voltage rail, and also from the positive voltage rail, through current source 332, and through transistors 321 and 323 to the negative voltage rail. Because transistors 312 and 322 are switched off, no current flows through these transistors, and the output current is zero.

When UP is asserted and DN is deasserted, transistors 313 and 322 are switched off, and transistors 312 and 323 are switched on. As a result, the current flowing through transistor 311 flows through transistor 312 to output 350 of the charge pump, producing a positive output current. On the other hand, when UP is deasserted and DN is asserted, transistors 313 and 322 are switched on, and transistors 312 and 323 are switched off. The current flowing through transistor 311 therefore flows through transistor 313 and current sink 331. Current also flows from output 350 through transistors 322 and 321 to the negative voltage rail, resulting in a negative output current.

As noted above, charge pumps typically suffer from limited output voltage range and ripple in their output current. Conventional designs must trade off improvements in output voltage range for improvements in ripple current. By increasing the size of the transistors in the charge pump, voltage range is increased, but ripple current is increased as well. If the size of the transistors in the charge pump is decreased, ripple current is decreased, but voltage range is also decreased.

The present system uses a folded cascode structure to increase the output voltage range of the charge pump without increasing the ripple in the output current. The use of cascode transistors helps increase the stability of the output current by, for example, isolating the output of the charge pump from the inputs, but still allows very rapid changes in the current.

Figure 4:
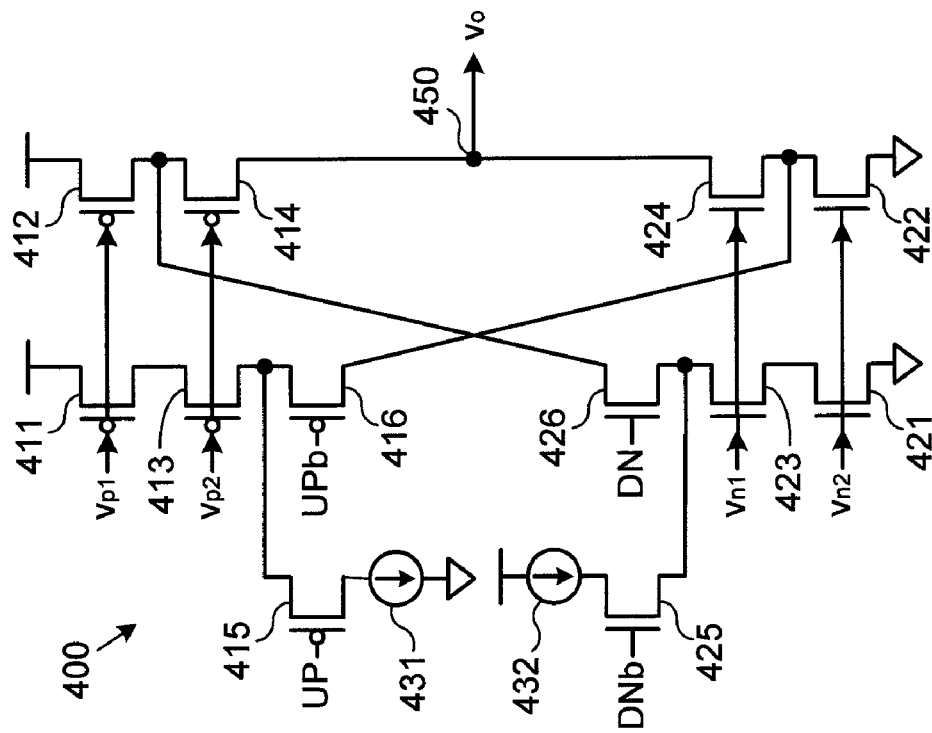
FIG. 4 is a diagram illustrating the structure of a charge pump in accordance with an exemplary embodiment of the invention.

Referring to FIG. 4, a diagram illustrating the structure of a charge pump in accordance with an exemplary embodiment of the invention is shown. In this embodiment, charge pump 400 includes six p-type transistors, six n-type transistors, a current source and a current sink. The sources of p-type transistors 411 and 412 are each connected to the positive voltage rail. The drains of transistors 411 and 412 are connected to the sources of p-type transistors 413 and 414, respectively. The drain of transistor 413 is tied to the sources of p-type transistors 415 and 416. The drain of transistor 415 is connected to current sink 431, which is connected to the negative voltage rail. The drain of transistor 416 is connected to the drain of n-type transistor 422 and the source of n-type transistor 424. The sources of n-type transistors 421 and 422 are each coupled to the negative voltage rail. The drains of transistors 421 and 422 are connected to the sources of n-type transistors 423 and 424, respectively. The drain of transistor 423 is tied to the sources of n-type transistors 425 and 426. The drain of transistor 425 is connected to current source 432, which is connected to the positive voltage rail. The drain of transistor 426 is connected to the drain of transistor 412 and the source of transistor 414. The output 450 of the charge pump is tied to the drains of p-type transistor 414 and n-type transistor 424.

Transistors 414 and 424 isolate switching transistors 426 and 416, respectively, from output node 450, and are therefore considered cascode transistors. The gates of transistors 411 and 413 are tied to the gates of transistors 412 and 414, respectively, thereby forming a current mirror circuit. Similarly, the gates of transistors 421 and 423 are tied to the gates of transistors 422 and 424, respectively, forming another current mirror circuit.

In this embodiment, p-type transistors 411 and 413, as well as n-type transistors 421 and 423, may be 10 micron transistors. P-type transistors 412 and 414 and n-type transistors 422 and 424 may be 20 micron transistors—twice as large as transistors 411, 413, 421 and 423. P-type transistors 415 and 416 and n-type transistors 425 and 426 are switching transistors and may, for example, be 5 micron transistors.

A bias voltage $v_{p1}$ is applied to the gates of p-type transistors 411 and 412 so that they are operating in the saturation region. Similarly, bias voltage $v_{p2}$ is applied to the gates of p-type transistors 413 and 414 so that they also operate in the saturation region. N-type transistors 421-424 are also biased to operate in the saturation region by applying bias voltage $v_{n1}$ to the gates of transistors 421 and 422, and applying bias voltage $v_{n2}$ to the gates of transistors 423 and 424. Control signal UP is applied to the gate of p-type transistor 415, while the inverse of this signal (UPb) is applied to the gate of p-type transistor 416. Control signal DN is applied to the gate of n-type transistor 425, while its inverse (DNb) is applied to the gate of n-type transistor 426.

Figure 5:
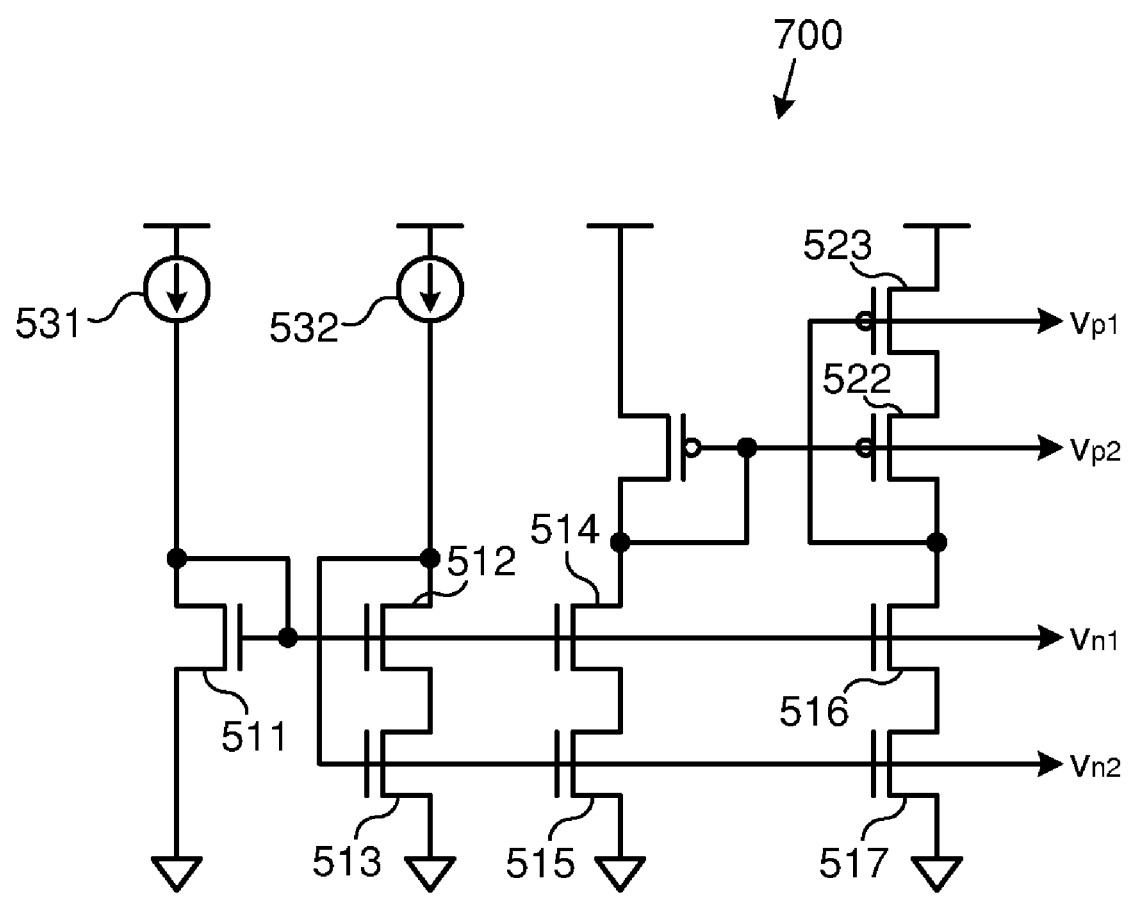
FIG. 5 is a diagram illustrating the structure of a bias circuit in accordance with one embodiment.

The bias currents ($v_{p1}$, $v_{p2}$, $V_{n1}$, $v_{n2}$) that are applied to the transistors in FIG. 4 can be generated using a circuit such as the one shown in FIG. 5. Referring to FIG. 5, bias circuit 500 includes three p-type transistors, seven n-type transistors and two current sources. Transistors 511 and 512 and current sources 531 and 532 form a current mirror. With the addition of transistors 513-515, a folded cascode current mirror is formed. The gates of transistors 511, 512, 514 and 516 are tied together and output as bias voltage $v_{n2}$. The drain of transistor is tied to the gates of transistors 513, 515 and 517 and is output as bias voltage $v_{n1}$. Transistors 521-523 form another current mirror. The drain of transistor 522 is tied to the gate of transistor 523 and is output as bias voltage $v_{p1}$. The drain of transistor 521 is tied to the gates of transistors 521 and 522 and is output as bias voltage $v_{p2}$.

Figure 6B:
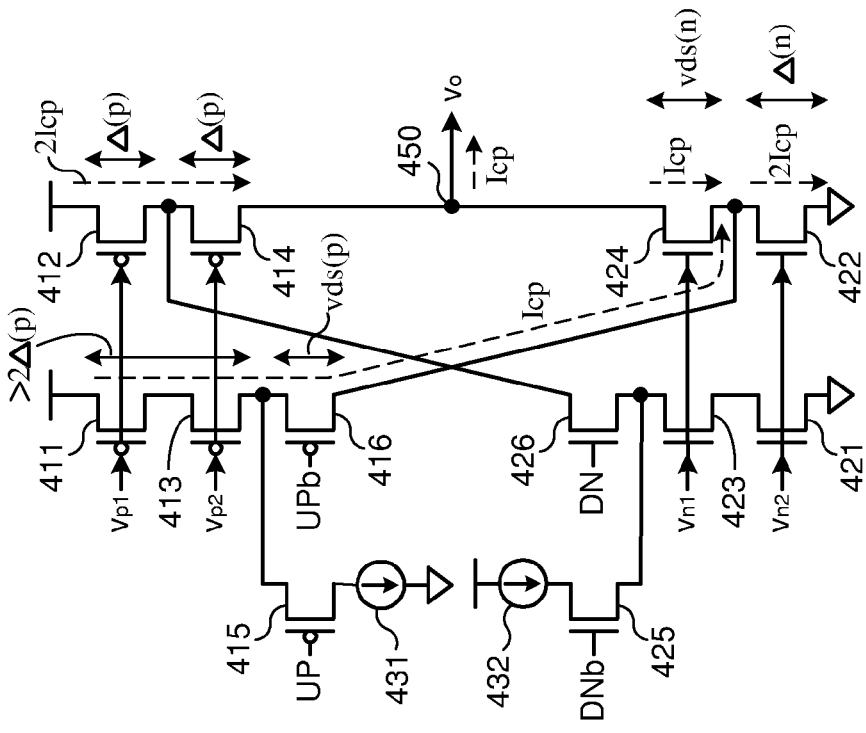
FIGS. 6A and 6B are a pair of diagrams illustrating the flow of currents through charge pump as shown in FIG. 4.
Figure 6A:
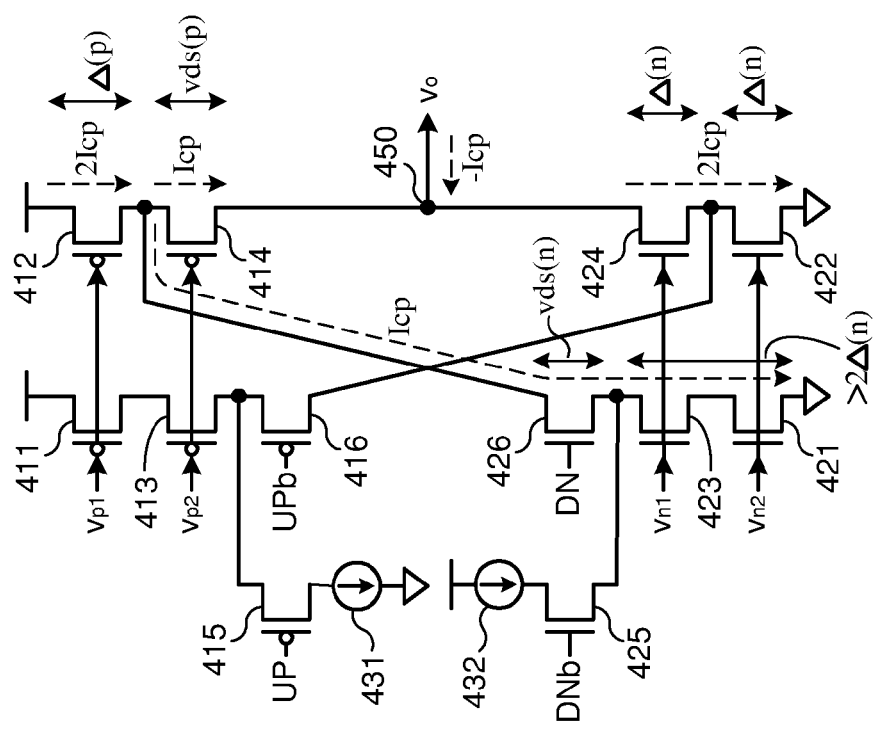

Referring to FIGS. 6A and 6B, a pair of diagrams illustrating the flow of currents through charge pump 400 are shown. FIG. 6A shows the flow of currents through the charge pump when the UP control signal is deasserted and the DN control signal is asserted. FIG. 6B shows the flow of currents through the charge pump when the DN control signal is deasserted and the UP control signal is asserted.

Referring to FIG. 6A, control signal UP is deasserted and control signal DN is asserted. Consequently, transistors 415 and 426 are switched on and transistors 416 and 425 are switched off. Because transistor 415 is switched on and transistor 416 is switched off, current flowing from the positive voltage rail through transistors 411 and 413 flows through transistor 415 and current sink 431 to the negative voltage rail. No current flows through transistor 416. Current flowing from the positive voltage rail through transistor 412 is split into two branches. A portion of the current flows through transistors 426, 423 and 421 to the negative voltage rail. The remainder of the current flows through transistors 414, 424 and 422 to the negative voltage rail.

As shown in FIG. 6A, the current flowing through transistor 412 has a magnitude of 2 Icp. The magnitude of the current flowing through transistors 426, 423 and 421 is Icp. Consequently, the magnitude of the current flowing through transistor 414 and into node 250 is Icp. The current flowing out of node 250 through transistors 424 and 422, however, has a magnitude of 2 Icp. A current having a magnitude of Icp must therefore flow from the output of the charge pump to node 250 so that the same amount of current is flowing into and out of the node. Thus, the charge pump generates a negative output current (i.e., current flows into the charge pump.)

Referring to FIG. 6B, control signal UP is asserted and control signal DN is deasserted. As a result, transistors 415 and 426 are switched off and transistors 416 and 425 are switched on. Because transistor 415 is switched off, current flowing from the positive voltage rail through transistors 411 and 413 flows through transistors 416 and 424 to the negative voltage rail. No current flows through transistor 415. Because transistor 426 is switched off, all of the current flowing from the positive voltage rail through transistor 412 flows through transistor 414 and into node 250. Current from node 250 flows through transistor 424 and transistor 422 to the negative voltage rail.

Because all of the current from transistors 411, 413 and 416 passes through transistor 422, the amount of current from transistor 424 that can also flow through transistor 422 is limited. In this case, 2 Icp can flow through transistor 422. Because Icp of current is flowing through transistor 422 from transistors 411, 413 and 416, only Icp of current can flow from transistor 424 through transistor 422. Then, because there is 2 Icp of current flowing into node 250 from transistors 412 and 414 and only Icp of current flowing out of node 250 through transistor 424, an output current of magnitude Icp must flow out of node 250 in order to equalize the currents flowing into and out of the node. Thus, the charge pump generates a positive output current (i.e., current flows out of the charge pump.)

Figure 7B:
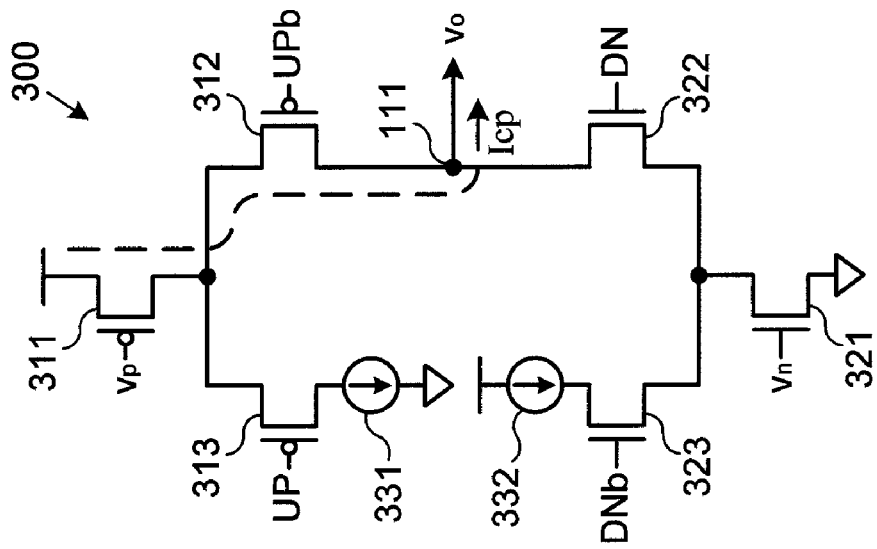
FIGS. 7A and 7B are a pair of diagrams illustrating the flow of currents through a charge pump utilizing the conventional design of FIG. 3.
Figure 7A:
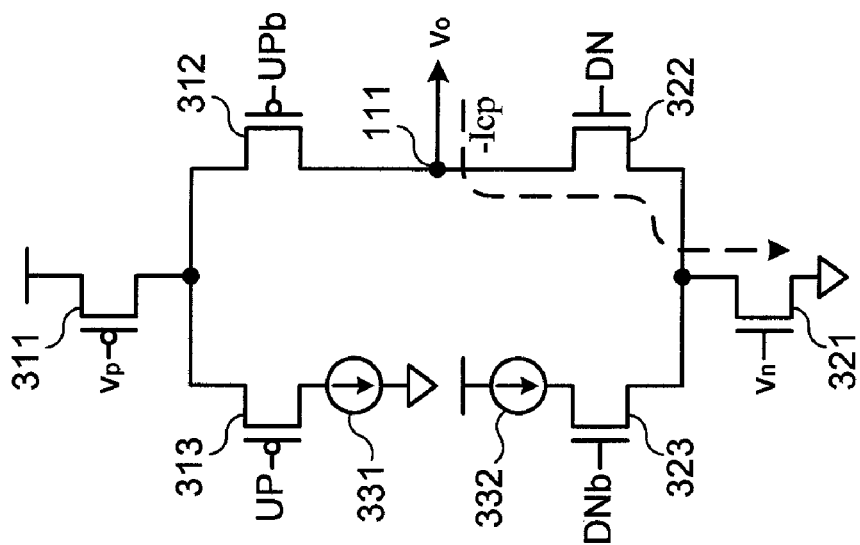

In order to show the advantage of the present design over a conventional charge pump design, it will be helpful to review the flow of currents through the conventional charge pump. Referring to FIGS. 7A and 7B, a pair of diagrams illustrating the flow of currents through a charge pump utilizing the conventional design of FIG. 3 are shown. The FIG. 7A shows the flow of currents through the conventional charge pump when the UP control signal is deasserted and the DN control signal is asserted. FIG. 7B shows the flow of currents through the conventional charge pump when the UP control signal is asserted and the DN control signal is deasserted.

Transistors 311 and 321 of charge pump 300 are biased by voltages $v_p$ and $v_n$, respectively, so that they both operate in the saturation region. When the UP control signal is asserted and the DN control signal is deasserted, transistors 312 and 323 are switched on, and transistors 313 and 322 are switched off. Consequently, current flows from the positive voltage rail three transistors 311 and 312 to node 350. Because transistor 322 is switched off, no current flows from node 350 through this transistor. Instead, there is a positive output current from node 350. When the DN control signal is asserted and the UP control signal is deasserted, transistors 313 and 322 are switched on and transistors 312 and 323 are switched off. As a result, current from transistor 311 flows through transistor 313 and current sink 331 to the negative voltage rail because transistor 312 is switched off and transistor 322 is switched on, current flows from node 350 through transistors 322 and 321 to the negative voltage rail. Thus, a negative output current is generated (i.e., current flows from the output to node 350 in order to equalize the current flowing out of node 350 to transistor 322. When both UP and DN are deasserted, no current flows in or out of node 350. Instead, current flows from the positive voltage rail, through transistors 311 and 313 to current sink 331, and from current source 332, through transistors 323 and 321 to the negative voltage rail.

The output voltage range that can be achieved by the conventional charge pump of FIGS. 3 and 7A-B can be determined by a brief analysis of the circuit. The maximum output voltage is the output rail voltage (Vdd), minus the voltages across transistors 311 and 312. Thus, $$v_o < Vdd - \Delta(p) - Vds(p), \quad \text{(eqn. 1)}$$

where $\Delta(p)$ is the overdrive voltage of p-type transistor 311 and Vds(p) is the drain-source voltage of p-type transistor 312. The overdrive voltage is the minimum voltage necessary to operate the transistor in the saturation region.

The minimum output voltage is the sum of the voltages across transistor 321 and transistor 322 (assuming the negative rail voltage is zero.) Thus, $$v_o > \Delta(n) + Vds(n), \quad \text{(eqn. 2)}$$

where $\Delta(n)$ is the overdrive voltage of n-type transistor 321 and Vds(n) is the drain-source voltage of n-type transistor 322.

A similar analysis can be performed with respect to charge pump 400, which is depicted in FIGS. 4 and 6A-B.

Referring to FIG. 6A, in which the UP to control signal is deasserted and the DN control signal is asserted to drive the output voltage down, it can be seen that when the transistors are operated in the saturation region, the output voltage is greater than the sum of the overdrive voltages of n-type transistors 422 and 424, and less than the positive rail voltage minus the sum of the overdrive voltages of p-type transistors 412 and 414. This can be expressed as follows:

$$2\Delta(n) < v_o < Vdd - 2\Delta(p). \quad \text{(eqn. 3)}$$

Further, tracing a path from output node 450 through transistors 414, 426, 423 and 421 to the negative voltage rail (ground) it can be seen that the sum of the output voltage and the drain-source voltage across p-type transistor 414 is greater than the sum of the drain-source voltage across n-type transistor 426 and the overdrive voltages of n-type transistors 423 and 421, or:

$$v_o + vds(p) > vds(n) + 2\Delta(n), \quad \text{(eqn. 4)}$$

where vds(p) is the drain-source voltage across p-type transistor 414 and vds(n) is the drain-source voltage across n-type transistor 426. Combining equations 3 and 4, the minimum output voltage can be expressed as:

$$v_o > vds(n) + \Delta(n) - (vds(p) - \Delta(n)) \quad \text{(eqn. 5)}.$$

Comparing this to the minimum output voltage for the conventional charge pump as expressed in equation 2, it can be seen that the equations differ by the term "$-(vds(p)-\Delta(n))$". Thus, the minimum voltage of the present charge is reduced by this amount in comparison to the minimum voltage of the conventional charge pump.

Referring to FIG. 6A, the UP to control signal is asserted and the DN control signal is deasserted. As noted above (see equation 3) when the transistors are operated in the saturation region, the output voltage is greater than the sum of the overdrive voltages of n-type transistors 422 and 424, and less than the positive rail voltage minus the sum of the overdrive voltages of p-type transistors 412 and 414. Tracing a path from output node 450 through transistors 424, 416, 413 and 411 to the positive voltage rail, it can be seen that the output voltage minus the drain-source voltage across n-type transistors 424 is less than the voltage at the positive rail (Vdd) minus the overdrive voltages of p-type transistors 411 and 413 and the drain-source voltage across p-type transistor 416. This can be expressed as shown below:

$$v_o - vds(n) > Vdd - vds(p) - 2\Delta(p), \quad \text{(eqn. 6)}$$

where vds(n) is the drain-source voltage across n-type transistor 424 and vds(p) is the drain-source voltage across p-type transistor 416. Combining equations 3 and 6, the maximum output voltage can be expressed as:

$$v_o < Vdd - vds(p) - \Delta(p) - (vds(n) - \Delta(p)) \quad \text{(eqn. 7)}.$$

Comparing this to the maximum output voltage for the conventional charge pump as expressed in equation 1, it can be seen that the equations differ by the term "$-(vds(n)-\Delta(p))$". The maximum voltage of the present charge is therefore increased by this amount in comparison to the maximum voltage of the conventional charge pump.

Figure 8:
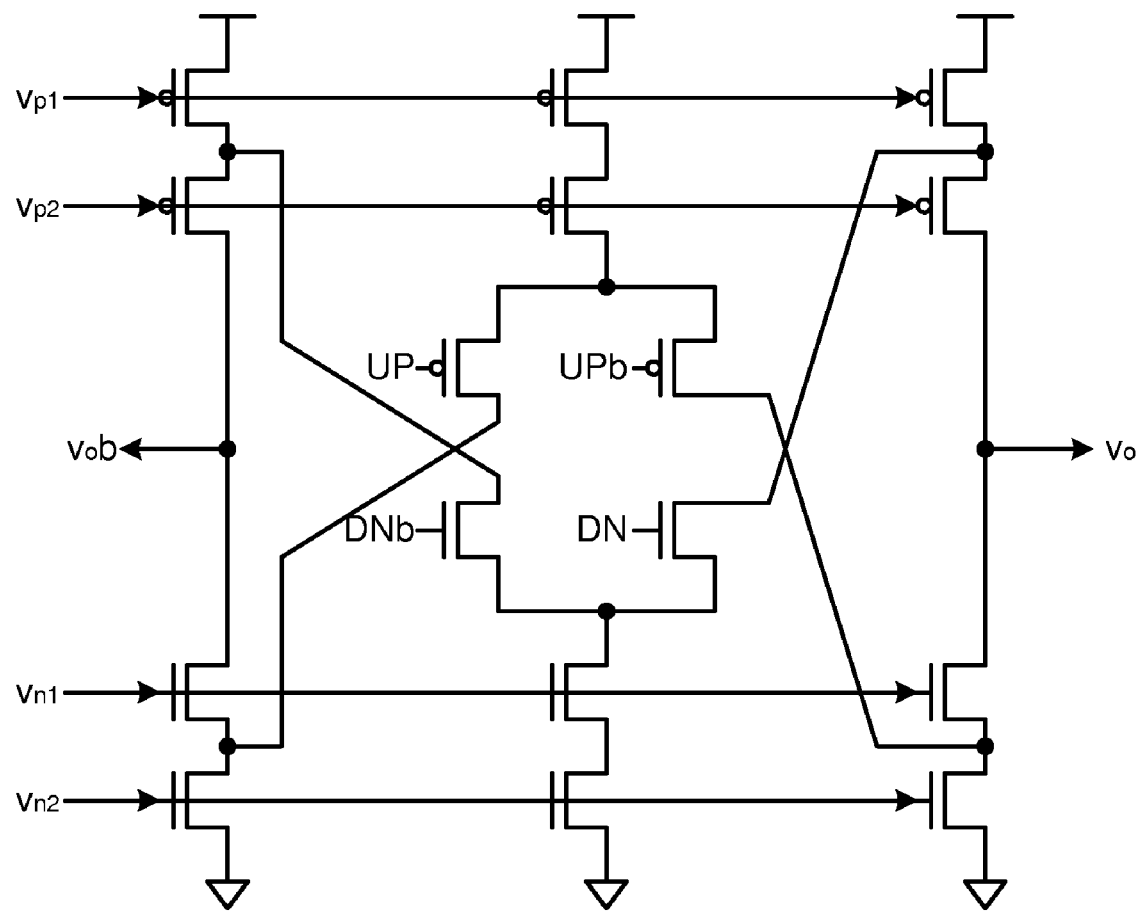
FIG. 8 is a diagram illustrating the structure of an exemplary differential charge pump using a folded cascode structure.

The foregoing description focuses on a charge pump having a single output. In an alternative embodiment, the charge pump may have a differential structure that provides an output voltage vo and its inverse vob. An exemplary differential charge pump using a folded cascode structure is illustrated in FIG. 8.

Another alternative embodiment is configured to enable the charge pump to receive control signals directly from the phase and frequency detector. Typically, the digital components of a PLL operate at a lower voltage than the analog components. Referring again to FIG. 1, phase and frequency detector 110 and frequency divider 140 are digital devices, while charge pump 120 and VCO 130 are analog devices.

Typically, the digital devices (phase and frequency detector 110 and frequency divider 140) are constructed using a thin oxide layer, while the analog devices (charge pump 120 and VCO 130) are constructed using a thick oxide layer. This is done in order to reject or reduce power supply noise caused by the digital devices. However, because the thin-oxide devices operate using a supply voltage that is lower than the supply voltage used by the thick-oxide devices, it is typically necessary to provide a converter between the phase and frequency detector and the charge pump in order to convert the low-voltage control signals (UP and DN) to the higher voltages used by the thick-oxide devices. Since this converter must operate at high frequencies, it may be difficult to design a suitable converter.

Figure 9:
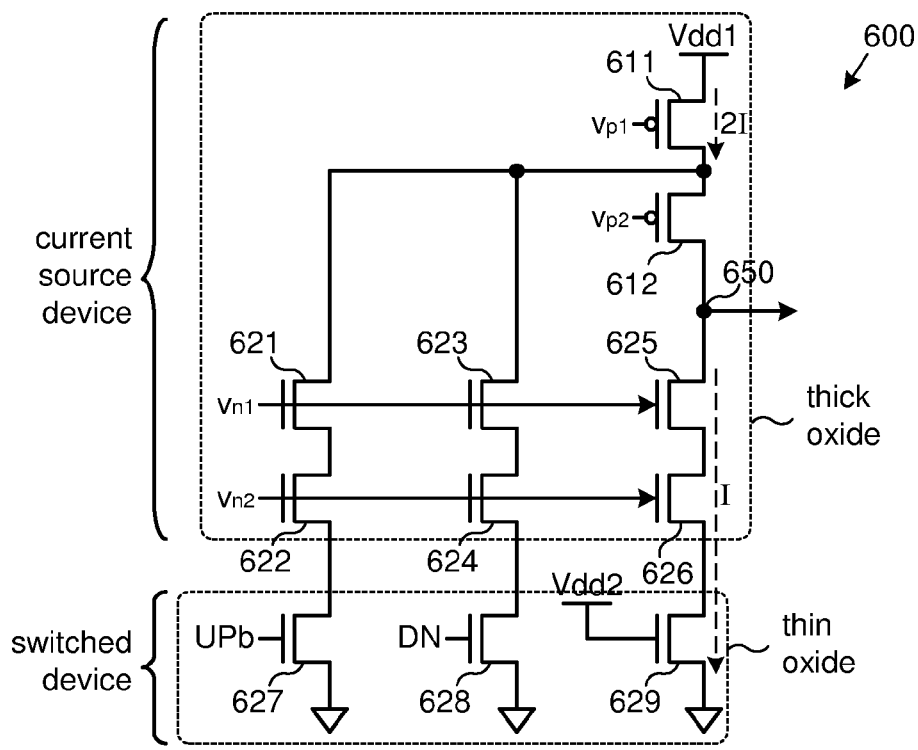
FIG. 9 is a diagram illustrating the structure of an exemplary charge pump that can accept low-voltage control signals.

One embodiment of the present charge pump is therefore designed to allow the charge pump to accept low-voltage control signals directly from the phase and frequency detector without the need for a converter to increase the voltages of the signals. FIG. 9 shows the structure of an exemplary charge pump that can accept low-voltage signals without the need for a converter. Referring to FIG. 9, it can be seen that charge pump 600 consists of a first set of transistors that are constructed using thick oxide and a second set of transistors that are constructed using thin oxide. The portion of the charge pump that is constructed using the thick oxide can be considered a current source device, while the portion of the charge pump constructed using the thin oxide can be considered a switched device. Because the switched portion of the device is constructed using thin oxide and operates based on the corresponding lower supply voltage, it can accept the control signals (UP and DN) directly from the phase and frequency detector.

P-type transistors 611 and 612 and n-type transistors 621-626 are constructed using thick oxide. These transistors operate in a first domain that uses a supply voltage of Vdd1. N-type transistors 627-629 are constructed using thin oxide and operate in a second domain uses a supply voltage of Vdd2. Vdd1 is typically around 1.5V, while Vdd2 is typically around 1.0V.

The source of transistor 611 is coupled to the positive voltage rail. The drain of transistor 611 is tied to the source of transistor 612. The drain of transistor 612 is connected to the output node 650. The drain of n-type transistor 625 is also connected to output node 650. The source of transistor 625 is tied to the drain of transistor 626. Thin-oxide transistor 629 is coupled between thick-oxide transistor 626 and the negative voltage rail.

The junction between transistors 611 and 612 is also connected to the drains of n-type transistors 621 and 623. The source of transistor 621 is tied to the drain of transistor 622, and the source of transistor 623 is tied to the drain of transistor 624. The source of thick-oxide transistor 622 is tied to the drain of thin-oxide transistor 627, and the source of transistor 627 is connected to the negative voltage rail. Similarly, the source of thick-oxide transistor 624 is tied to the drain of thin-oxide transistor 628, while the source of transistor 628 is connected to the negative voltage rail.

P-type transistor 611 is operated in the saturation region by applying a bias voltage $v_{p1}$ to its gate. Another bias voltage, $v_{p2}$, is applied to the gate of transistor 612 so that this transistor also operates in the saturation region. A third bias voltage, $v_{n2}$, is applied to the gates of n-type transistors 621, 623 and 625, and a fourth bias voltage, $v_{n1}$, is applied to the gates of n-type transistors 622, 624 and 626. Voltages $v_{n1}$ and $v_{n2}$ bias transistors 621-626 so that they also operate in the saturation region.

Charge pump 600 operates as follows. Transistor 611 acts as a current source which has a constant current of 2 I flowing through it. This current may then flow either through transistor 612, or through the branches consisting of transistors 621/622/627, and 623/624/628, respectively, depending upon which of the control signals (UP, UPb, DN, DNb) are asserted and deasserted. When UP is low (hence UPb is high) transistor 627 is switched on, so a current of I flows through transistors 621, 622 and 627. When DN is high (hence DNb is low) transistor 628 is switched on, so a current of I close through transistors 623, 624 and 628. Transistors 625 and 626 act as a current source which has a constant current of I flowing through it, since switching transistor 629 is always switched on.

When control signals UP and DN are both asserted, transistor 628 is switched on and transistor 627 is switched off. Consequently, current flows through transistors 623, 624 and 628, but not through transistors 621, 622 and 627. Thus, half of the 2 I of current flowing through transistor 611 flows through transistors 623, 624 and 628, while the other half flows through transistor 612. Since there is a current of I flowing from transistor 612 to node 650, and a current of I flowing from node 650 through transistors 625, 626 and 619, current is conserved at node 650, and the output current of the charge pump is zero.

When neither of control signals UP nor DN is asserted (both UPb and DNb are asserted) transistor 627 is switched on and transistor 628 is switched off. As a result, current flows through transistors 621, 622 and 627, but not through transistors 623, 624 and 628. This causes half of the 2 I of current flowing through transistor 611 to flow through transistors 623, 624 and 628, while the other half flows through transistor 612. There is therefore a current of I flowing from transistor 612 to node 650, and a current of I flowing from node 650 through transistors 625, 626 and 619, so the output current of the charge pump is again zero.

When DN is asserted and UP is deasserted, both of transistors 627 and 628 are switched on. An amount of current I therefore flows through transistors 621, 622 and 627, and the same amount flows through transistors 623, 624 and 628. Thus, the 2 I of current flowing through transistor 611 all flows through these transistors, and none of the current flows through transistor 612. Because transistors 625, 626 and 629 draw a current I from node 650, the charge pump's output current is −I.

Conversely, when UP is asserted and DN is deasserted, neither of transistors 627 and 628 is switched on. Consequently, none of the current flowing from transistor 611 goes to either of the branches containing these transistors. The entire 2 I of current from transistor 611 flows through transistor 612 and into node 650. Since transistors 625, 626 and 629 draw current I from node 650, the output current of the charge pump is I. The charge pump output current (Icp) as a function of the control signals UP and DN is shown in Table 1. Table 1 also shows the currents flowing through transistors 612 and 625 (Ip and In, respectively.)

TABLE 1

| UP | DN | Ip | In | Icp |
|----|----|----|----|-----|
| 0  | 0  | I  | −I | 0   |
| 0  | 1  | 0  | −I | −I  |
| 1  | 0  | 2I | −I | I   |
| 1  | 1  | I  | −I | 0   |

Figure 10:
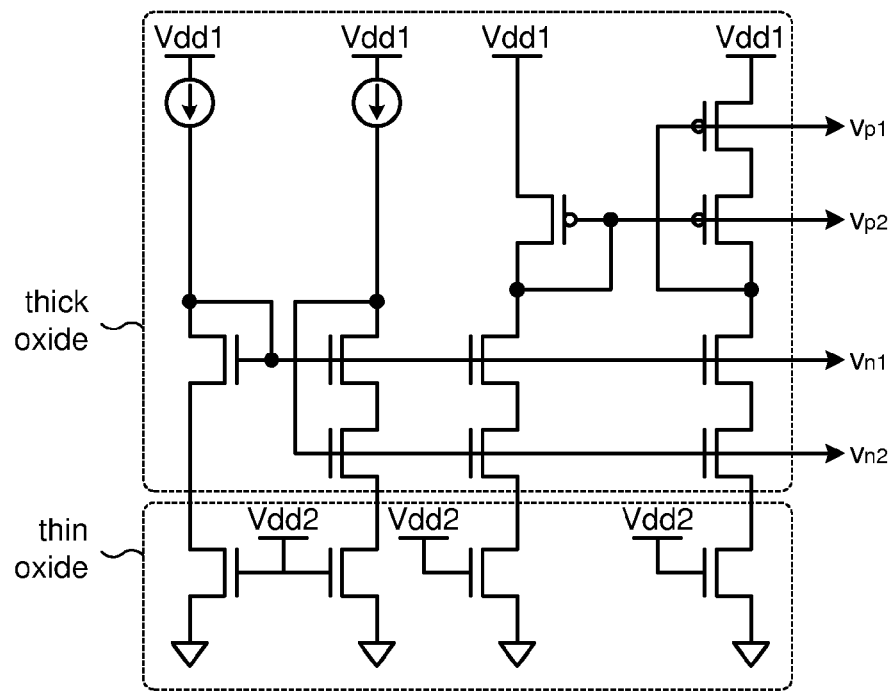
FIG. 10 is a diagram illustrating the structure of a bias circuit in accordance with an alternative embodiment.

The bias voltages that are applied to the gates of transistors 611-612 and 621-626 can be generated by the circuit shown in FIG. 5. Alternatively, these bias voltages can be generated by the bias circuit shown in FIG. 10. The circuit of FIG. 10 is very similar to that of FIG. 5, except that a set of thin-oxide switching transistors are inserted between the current source transistors and the negative voltage rail. The remainder of the circuit is identical to the circuit of FIG. 5 and operates in the same manner, so it will not be discussed in any further detail here.

The charge pump described in connection with FIG. 9 provides a single output that builds that builds up a charge at an output node and thereby produces an output voltage to control a voltage controlled oscillator. It may be desirable in some systems for a charge pump to provide a differential output, so an alternative embodiment of the invention may be configured as a differential circuit. An exemplary differential-type charge pump that can accept low-voltage control signals is shown in FIG. 11.

Figure 11:
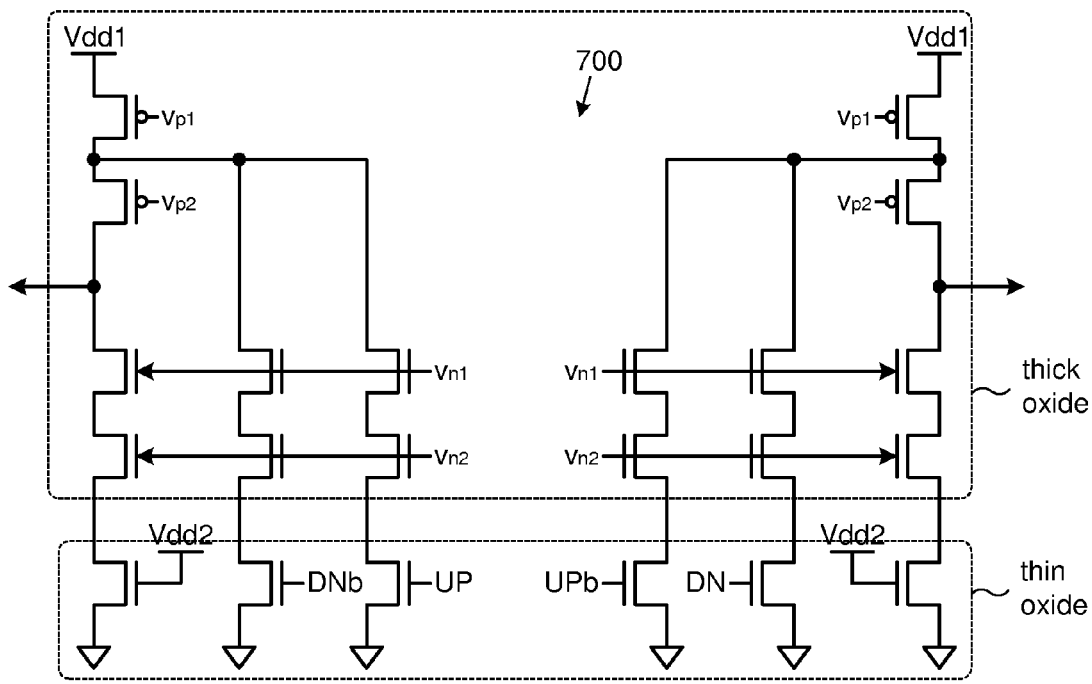
FIG. 11 is a diagram illustrating the structure of an exemplary differential-type charge pump that can accept low-voltage control signals.

Referring to FIG. 11, a diagram illustrating a charge pump having differential outputs is shown. The structure of charge pump 700 includes two halves, one of which is identical to the non-differential charge pump of FIG. 9, and the other of which is structurally identical to non-differential charge pump 600, but which has different control inputs.

It can be seen that the right half (701) of charge pump 700 is identical to charge pump 600, including the fact that control signal UPb is applied to the gate of transistor 727 and control signal DN is applied to the gate of transistor 728. The left half (702) of charge pump 700 is illustrated as a mirror image of the right half (701) and is structurally identical to it, but different control signals are applied to switching transistors 737 and 738. Control signal UP (rather than UPb) is applied to the gate of transistor 737, while DNb (rather than DN) is applied to the gate of transistor 738. Because these control signals are the inverses of the control signals applied to the gates of corresponding transistors 727 and 728, the left half (702) of the differential charge pump produces an output current which is the opposite of that produced by the right half (701) of the charge pump.

It can be seen that the same bias voltages are applied to the gates of corresponding transistors in the right and left halves of charge pump 700. These bias voltages can be generated by the same circuits described above in connection with charge pump 600 (i.e., the circuits illustrated in FIGS. 5 and 10.)

Figure 12:
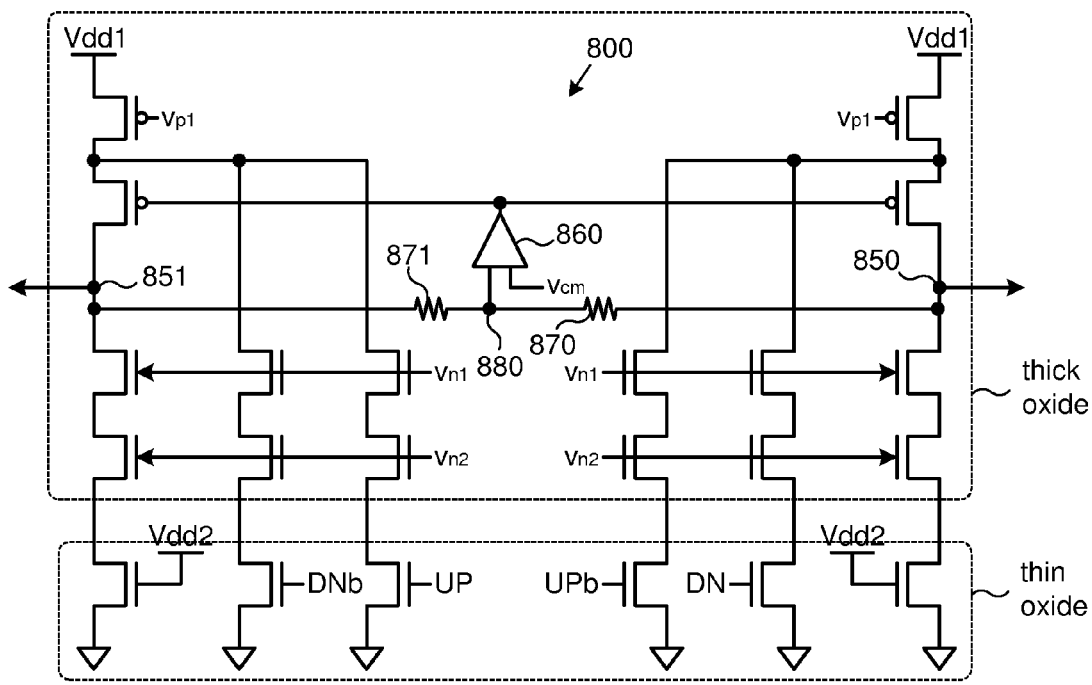
FIG. 12 is a diagram illustrating the structure of another alternative differential-type charge pump that can accept low-voltage control signals.

Referring to FIG. 12, another alternative embodiment of the present charge pump is shown. In this embodiment, the charge pump uses a differential-type structure similar to that shown in FIG. 11, but additional circuitry designed to provide common mode feedback is provided. This feedback circuitry is included in order to provide a mechanism for adjusting the output voltages so that their average is equal to a specific common mode voltage. This common mode voltage is typically half of the positive supply rail voltage for the thick-oxide devices.

In this embodiment, two resistors (870, 871) are connected in series between output nodes 850 and 851. Resistors 870 and 871 have substantially the same resistance, so that the voltage at node 880 is the average of the voltages at nodes 870 and 871. Node 880 is connected to one of the two inputs of a differential amplifier 860. A common mode voltage $V_{cm}$ is provided as the second input to amplifier 860. The output of amplifier 860 is connected to the gates of transistors 812 and 822. When the voltage at node 880 is below the common mode voltage, the output of amplifier 860 decreases. This increases the current flowing through transistors 812 and 822, thereby increasing the voltages at nodes 850, 851 and 880. When the voltage at node 880 is above the common mode voltage, the output of amplifier 860 increases, which in turn decreases the current flowing through transistors 812 and 822 and decreases the voltages at nodes 850, 851 and 880. The system thereby drives the average of the voltages at nodes 850 and 851 to the common mode voltage.

The various illustrative logical blocks, modules, and circuits described in connection with the embodiments disclosed herein may be implemented or performed with application specific integrated circuits (ASICs), discrete transistors or other hardware, or any combination thereof designed to perform the functions described herein.

The benefits and advantages which may be provided by the present invention have been described above with regard to specific embodiments. These benefits and advantages, and any elements or limitations that may cause them to occur or to become more pronounced are not to be construed as critical, required, or essential features of any or all of the claims. As used herein, the terms "comprises," "comprising," or any other variations thereof, are intended to be interpreted as non-exclusively including the elements or limitations which follow those terms. Accordingly, a system, method, or other embodiment that comprises a set of elements is not limited to only those elements, and may include other elements not expressly listed or inherent to the claimed embodiment.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein and recited within the following claims.

What is claimed is:

1. A system comprising:
a charge pump;
wherein the charge pump includes a plurality of inputs configured to receive two or more control signals;
wherein the charge pump includes one or more outputs, wherein each of the outputs is configured to provide an output current that is based on the control signals;
wherein each of the inputs is isolated from the outputs by at least a corresponding cascode transistor;
wherein the charge pump includes current mirror circuitry; and
wherein the charge pump includes
 a first p-type transistor, wherein the source of the first p-type transistor is connected to a positive voltage rail,
 a second p-type transistor, wherein the source of the second p-type transistor is connected to the positive voltage rail,
 a third p-type transistor, wherein the source of the third p-type transistor is connected to the drain of the first p-type transistor,
 a fourth p-type transistor, wherein the source of the fourth p-type transistor is connected to the drain of the second p-type transistor,
 a fifth p-type transistor, wherein the source of the fifth p-type transistor is connected to the drain of the third p-type transistor,
 a sixth p-type transistor, wherein the source of the sixth p-type transistor is connected to the drain of the third p-type transistor,
 a current drain coupled between the drain of the fifth p-type transistor and a negative voltage rail,
 a first n-type transistor, wherein the source of the first n-type transistor is connected to the negative voltage rail,
 a second n-type transistor, wherein the source of the second n-type transistor is connected to the negative voltage rail,
 a third n-type transistor, wherein the source of the third n-type transistor is connected to the drain of the first n-type transistor,
 a fourth n-type transistor, wherein the source of the fourth n-type transistor is connected to the drain of the second n-type transistor,
 a fifth n-type transistor, wherein the source of the fifth n-type transistor is connected to the drain of the third n-type transistor,
 a sixth n-type transistor, wherein the source of the sixth n-type transistor is connected to the drain of the third n-type transistor, and
 a current source coupled between the drain of the fifth n-type transistor and the positive voltage rail,
 wherein the drain of the second p-type transistor is connected to the drain of the sixth n-type transistor,
 wherein the drain of the second n-type transistor is connected to the drain of the sixth p-type transistor,
 wherein the drain of the fourth p-type transistor and the drain of the fourth n-type transistor are connected to a first one of the outputs,
 wherein the gates of the first and second p-type transistors are tied together,
 wherein the gates of the third and fourth p-type transistors are tied together,
 wherein the gates of the first and second n-type transistors are tied together,
 wherein the gates of the third and fourth n-type transistors are tied together,
 wherein the first, second, third and fourth p-type transistors and the first, second, third and fourth n-type transistors are biased to operate in a saturation region,
 wherein an UP control signal is applied to the gate of the fifth p-type transistor and the inverse of the UP control signal is applied to the gate of the sixth p-type transistor, and
 wherein a DN control signal is applied to the gate of the sixth n-type transistor and the inverse of the DN control signal is applied to the gate of the fifth n-type transistor.

2. The system of claim 1, wherein the first and third n-type transistors have a first size, the second and forth n-type transistors and the first and third p-type transistors have a second size which is twice the first size, and the second and forth p-type transistors have a third size which is twice the second size.

3. The system of claim 2, wherein the first size is 5 microns, the second size is 10 microns and the third size is 20 microns.

4. The system of claim 1, wherein the control signals include an UP signal and a DN signal and wherein the output current for at least one of the outputs is positive when the UP signal is asserted and negative when the DN signal is asserted.

5. The system of claim 4, wherein the output current for at least one of the outputs is substantially zero when neither the UP signal nor the DN signal is asserted.

6. The system of claim 1, wherein each of the inputs is connected to the gate of a corresponding switching transistor.

7. The system of claim 6, wherein the source of the cascode transistor corresponding to each input is connected to the drain of the switching transistor to which the input is connected.

8. The system of claim 7, wherein the current mirror circuitry comprises a first current source transistor, a second current source transistor and a third current source transistor, wherein the drain of the first current source transistor is connected to the source of the cascode transistor, wherein the drain of the third current source transistor is connected to the source of the second current source transistor, and wherein the gate of the second current source transistor is connected to the gate of the cascode transistor and the gate of the third current source transistor is connected to the gate of the first current source transistor.

9. The system of claim 1, further comprising: a phase and frequency detector coupled to the charge pump and configured to provide the control signals to the charge pump; and a voltage controlled oscillator having a control input coupled to the one or more outputs of the charge pump and configured to generate an oscillating output signal having a frequency that is dependent upon a voltage of the one or more outputs of the charge pump.

10. The system of claim 1, further comprising a bias voltage generator coupled to the charge pump, wherein the bias voltage generator provides one or more bias voltages that are applied to the gates of the cascode transistors and one or more current source transistors in the current mirror circuitry, wherein the bias voltages cause the cascode transistors and one or more current source transistors in the current mirror circuitry to operate in a saturation region.

11. The system of claim 1, wherein the charge pump is a differential-type charge pump having two outputs, wherein a first output current provided at a first one of the outputs opposite but substantially equal in magnitude to a second output current provided at a second one of the outputs.

12. The system of claim 1, wherein each of the inputs is connected to the gate of a corresponding switching transistor, wherein the switching transistors are thin-oxide transistors that are configured to operate at a first voltage, and wherein the cascode transistors are thick-oxide transistors that are configured to operate at a second voltage that is greater than the first voltage.

13. The system of claim 12, wherein the charge pump includes:
- a first p-type transistor, wherein the source of the first p-type transistor is connected to a positive voltage rail;
- a second p-type transistor, wherein the source of the second p-type transistor is connected to the drain of the first p-type transistor;
- a first n-type transistor, wherein the source of the first n-type transistor is connected to the negative voltage rail;
- a second n-type transistor, wherein the source of the second n-type transistor is connected to the drain of the first n-type transistor;
- a third n-type transistor, wherein the source of the third n-type transistor is connected to the drain of the second n-type transistor and the drain of the third n-type transistor is connected to the drain of the first p-type transistor;
- a fourth n-type transistor, wherein the source of the fourth n-type transistor is connected to the negative voltage rail;
- a fifth n-type transistor, wherein the source of the fifth n-type transistor is connected to the drain of the fourth n-type transistor;
- a sixth n-type transistor, wherein the source of the sixth n-type transistor is connected to the drain of the fifth n-type transistor and the drain of the sixth n-type transistor is connected to the drain of the first p-type transistor;
- a seventh n-type transistor, wherein the source of the seventh n-type transistor is connected to the negative voltage rail;
- a eighth n-type transistor, wherein the source of the eighth n-type transistor is connected to the drain of the seventh n-type transistor; and
- a ninth n-type transistor, wherein the source of the ninth n-type transistor is connected to the drain of the eighth n-type transistor and the drain of the ninth n-type transistor is connected to the drain of the second p-type transistor;

wherein the drain of the second p-type transistor and the drain of the ninth n-type transistor are connected to a first one of the outputs;

wherein the gates of the first, fourth and seventh n-type transistors are tied together;

wherein the gates of the second, fifth and eighth n-type transistors are tied together;

wherein the first and second p-type transistors and the first, second, fourth, fifth, seventh, eighth and ninth n-type transistors are biased to operate in a saturation region;

wherein an UPb control signal is applied to the gate of the third n-type transistor;

wherein a DN control signal is applied to the gate of the sixth n-type transistor;

wherein the third, sixth and ninth n-type transistors are switching transistors that are configured to operate at a first voltage; and wherein the first and second p-type transistors, and the first, second, fourth, fifth, seventh and eighth n-type transistors are current source transistors that are configured to operate at a second voltage that is greater than the first voltage.

14. The system of claim 13, wherein the charge pump is a differential-type charge pump having two outputs, wherein a first output current provided at a first one of the outputs opposite but substantially equal in magnitude to a second output current provided at a second one of the outputs.

15. The system of claim 14, further comprising level-shifting circuitry connected to each of the two outputs and configured to drive an average of the voltages at the two outputs to a common mode voltage.

* * * * *